US011778803B2

(12) United States Patent
Schultz

(10) Patent No.: US 11,778,803 B2
(45) Date of Patent: Oct. 3, 2023

(54) CROSS FET SRAM CELL LAYOUT

(71) Applicant: Advanced Micro Devices, Inc., Santa Clara, CA (US)

(72) Inventor: Richard T. Schultz, Ft. Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/489,252

(22) Filed: Sep. 29, 2021

(65) Prior Publication Data

US 2023/0096892 A1 Mar. 30, 2023

(51) Int. Cl.
G11C 7/10 (2006.01)
H10B 10/00 (2023.01)
H01L 29/423 (2006.01)

(52) U.S. Cl.
CPC ........... *H10B 10/12* (2023.02); *G11C 7/1045* (2013.01); *H01L 29/42392* (2013.01)

(58) Field of Classification Search
CPC .......... H01L 27/1104; H01L 29/42392; H01L 27/0207; G11C 7/1045; G11C 5/025; G11C 11/412; H10B 10/12
USPC ....................................................... 365/154
See application file for complete search history.

(56) References Cited

U.S. PATENT DOCUMENTS

| 6,549,987 B1 | 4/2003 | Rappoport et al. |
| 8,645,893 B1 | 2/2014 | Yeung et al. |
| 9,275,721 B2 | 3/2016 | Chen et al. |
| 9,575,891 B2 | 2/2017 | Riley et al. |
| 2019/0319021 A1 | 10/2019 | Xu et al. |
| 2020/0098859 A1 | 3/2020 | Reboh et al. |
| 2020/0105761 A1 | 4/2020 | Liaw |
| 2020/0135740 A1* | 4/2020 | Liaw ................... H01L 27/1104 |
| 2022/0093503 A1 | 3/2022 | Wuu et al. |
| 2022/0093504 A1 | 3/2022 | Schultz et al. |
| 2022/0302111 A1 | 9/2022 | Wu et al. |

FOREIGN PATENT DOCUMENTS

| DE | 102020106252 A1 | 10/2020 | |
| WO | WO-2021125138 A1 * | 6/2021 | ........ H01L 27/11226 |

OTHER PUBLICATIONS

Schultz, Richard T., U.S. Appl. No. 17/489,316, entitled "Cross Field Effect Transistor Library Cell Architecture Design", filed Sep. 29, 2021, 44 pages.

(Continued)

*Primary Examiner* — Fernando Hidalgo
(74) *Attorney, Agent, or Firm* — KOWERT HOOD MUNYON RANKIN AND GOETZEL PC; Rory D. Rankin

(57) ABSTRACT

A system and method for efficiently creating layout for memory bit cells are described. In various implementations, a memory bit cell uses Cross field effect transistors (FETs) that include vertically stacked gate all around (GAA) transistors with conducting channels oriented in an orthogonal direction between them. The channels of the vertically stacked transistors use opposite doping polarities. The memory bit cell includes one of a read bit line and a write word line routed in no other metal layer other than a local interconnect layer. In addition, a six transistor (6T) random access data storage of the given memory bit cell consumes a planar area above a silicon substrate of four transistors.

20 Claims, 17 Drawing Sheets

(56) References Cited

OTHER PUBLICATIONS

International Search Report and Written Opinion in International Application No. PCT/US2022/076215, dated Jan. 2, 2023, 13 pages.
Non-Final Office Action in U.S. Appl. No. 17/489,316, dated Jan. 4, 2023, 9 pages.

* cited by examiner

CROSS FET SRAM CELL LAYOUT

BACKGROUND

Description of the Relevant Art

As both semiconductor manufacturing processes advance and on-die geometric dimensions reduce, semiconductor chips provide more functionality and performance while consuming less space. While many advances have been made, design issues still arise with modern techniques in processing and integrated circuit design that limit potential benefits. For example, capacitive coupling, electro migration, short channel effects such as at least leakage currents, and processing yield are some issues which affect the placement of devices and the routing of signals across an entire die of a semiconductor chip. These issues have the potential to delay completion of the design and affect the time to market.

In order to shorten the design cycle for semiconductor chips, manual full-custom designs are replaced with automation where possible. In some cases, a standard cell layout is created manually. In other cases, the rules used by the place-and-route tool are adjusted to automate the cell creation. However, the automated process at times does not satisfy each of the rules directed at performance, power consumption, signal integrity, process yield, both local and external signal routing including internal cross coupled connections, pin access, and so on. Therefore, designers manually create these cells to achieve better results for the multiple characteristics or rewrite the rules for the place-and-route tool. However, many times, the layout tools and rules are setup for planer devices, rather than for the relatively recent non-planar devices. One example of these cells is the memory bit cell of a random access memory.

Generally speaking, a variety of semiconductor chips include at least one processing unit coupled to a memory. The processing unit sends memory access requests to the memory for fetching instructions, fetching data, and storing results of computations. Static random access memory (SRAM) is commonly used as the memory. The SRAM includes an array of many memory bit cells and surrounding circuitry used for accessing values stored in the array. The die or the package may include other units or components in addition to the processing unit and the memory. The dimensions of the individual components have limits in order to place all of the components on a same die or a same package. For several types of memory, such as the SRAM, the dimensions are large enough that they interfere with the placement of other components. Consequently, the chip is rendered inoperable or requires a larger and more expensive package without significant redesign.

In view of the above, methods and systems for efficiently creating layout for memory bit cells are desired.

Figure 1:
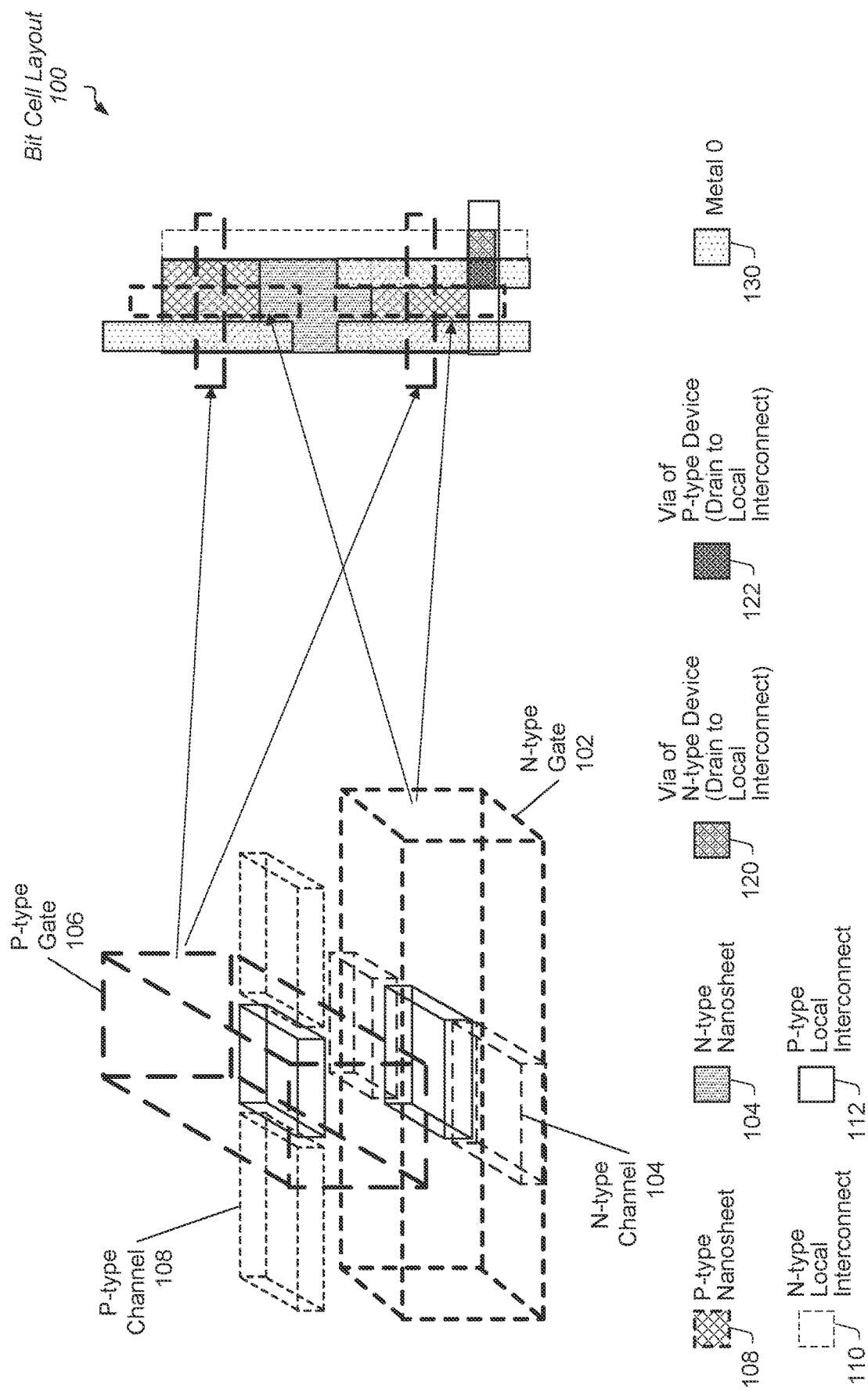
FIG. 1 is a generalized diagram of a top view of standard cell layout utilizing Cross field effect transistors (FETs).

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for efficiently creating layout for memory bit cells are contemplated. In various implementations, one or more standard cells include cross field effect transistors (FETs). As used herein, "Cross FETs" are also referred to as a "XFETs." Additionally, as used herein, a "transistor" is also referred to as a "semiconductor device" or a "device." In some implementations, the Cross FETs are vertically stacked gate all around (GAA) transistors such as a top vertical GAA transistor (or GAA transistor) is formed vertically on top of a bottom GAA transistor with at least an isolating oxide layer in between the two GAA transistors. In addition, the top GAA transistor has one or more conducting channels positioned orthogonal to the one or more conducting channels of the bottom GAA transistor. Therefore, the direction of current flow of the top GAA transistor through one or more top channels is orthogonal to the direction of current flow of the one or more bottom channels of the bottom GAA transistor.

The top GAA transistor has a doping polarity of one or more top channels that is an opposite polarity of the doping polarity of one or more bottom channels of the bottom GAA transistor. For example, in an implementation, the top GAA transistor includes one or more p-type channels, whereas, the bottom GAA transistor includes one or more n-type channels. In another implementation, the p-type and n-type polarities are reversed between the one or more channels of the top GAA transistor and the bottom GAA transistor. With the orthogonal orientation between the top GAA transistor and the bottom GAA transistor, both the top and bottom GAA transistors have the maximum mobility for their respective carriers based on their orientation.

A memory array (or array) utilizes memory bit cells arranged as multiple rows and multiple columns. These memory bit cells use vertically stacked GAA transistors with the orthogonal orientation between the top and bottom transistors. In other words, these memory bit cells use Cross FETs. The memory bit cell includes one of a read bit line and a write word line routed in no other metal layer other than a local interconnect layer. In addition, circuitry of a six transistor (6T) random access data storage of the given memory bit cell consumes a planar area above a silicon substrate of four transistors. For example, data storage using a back-to-back configuration of two inverters includes two n-type devices. The two p-type devices used in the data storage are located above these two n-type devices, and thus, do not occupy further planar area above the silicon substrate. The pass gates of the memory bit cell use an additional two n-type devices. The use of wrap around contacts for creating connections between a p-type devices and an n-type device is unnecessary, although it is still an option. The use of Cross FETs in the memory bit cell reduces the planar area of the cell, increases performance, reduces power consumption, and reduces signal congestion.

Turning now to FIG. 1, a generalized block diagram of a top view of a standard cell layout 100 is shown that uses Cross FETs. The standard cell layout 100 is for an inverter using Cross FETs. However, in other implementations, the characteristics and techniques used for standard cell layout 100 is used for a variety of other types of Boolean gates and complex gates. A three-dimensional (3-D) illustration of the p-type and n-type Cross FETs accompanies the layout 100. As shown, a p-type device is vertically stacked on an n-type device. The n-type device includes at least an n-type gate 102 formed all around an n-type channel 104. Similarly, a p-type gate 106 is formed all around a p-type channel 108. Therefore, the p-type channel 108 has a doping polarity that is an opposite polarity of the n-type channel 104 of the bottom n-type device. Although a single n-type channel 104 and a single p-type channel 108 is shown, in other implementations, the semiconductor devices include another number of channels. In some implementations, the channel is a lateral nanowire. In other implementations, the channel is a nanosheet.

The n-type channel 104 and the n-type gate 102 are oriented in an orthogonal direction to the p-type channel 108 and the p-type gate 106. In other words, the n-type channel 104 and the n-type gate 102 are oriented in a direction that is 90 degrees from a direction of the p-type channel 108 and the p-type gate 106. Therefore, the direction of current flow of the bottom n-type device through the n-type channel 104 is orthogonal to the direction of current flow of the p-type channel 108 of the top p-type device. With the orthogonal orientation between the top p-type device and the bottom n-type device, both devices have the maximum mobility for their respective carriers based on their orientation. In addition, the orthogonal orientation of the top p-type device and the bottom n-type device allow connections between the vertically stacked devices to use a single via layer.

In the standard cell layout 100, the metal zero layer (M0 or Metal0) 130 is the top-most layer. A gate contact would be a next vertically highest layer, but the gate contacts are not shown for ease of illustration. The p-type gate 106 is the next vertically highest layer followed by the p-type nanosheet 108, which creates the p-type channel. Insulating layers are between the top p-type device and the bottom n-type device with a gate contact formed between the devices in the insulating layers. This gate contact is not shown with the aerial top view provided by the standard cell layout 100 (or layout 100). Cross-section views of standard cell layout are provided later. The gate contact between the vertically stacked devices is directly connected to the p-type metal gate 106 and the n-type metal gate 102 without traversing any metal layers.

The via (or contact) 122 of the p-type device connects the drain region of the p-type device to local interconnect 112 of the p-type device. The via (or contact) 120 of the n-type device connects the drain region of the n-type device to local interconnect 110 of the n-type device. The vertically stacked devices of the layout 100 consumes less on-die area. The use of a single via layer reduces resistance and capacitance of the circuit. Compared to Fin FETs, the use of gate all around (GAA) nanowires or nanosheets provides lower threshold voltages, faster switching times, less leakage currents, and further reduction of short channel effects. Examples of short channel effects other than leakage current are latchup effects, drain-induced barrier lowering (DIBL), punchthrough, performance dependency on temperature, impact ionization, and parasitic capacitance to the silicon substrate and to the wells used for the source and drain regions.

One advantage of the orthogonal orientation of the Cross FETs in the layout 100 includes a single via layer. In contrast, Complementary FETs (CFETs) use multiple metal layers and multiple via layers to make connections between vertically stacked devices. Gaining access to the source and drain regions of the bottom device of Cross FETs is easier than compared with CFETs. Another advantage of the orthogonal orientation of the Cross FETs in the layout 100 is use of the maximum mobility of each of the carriers in each device of the vertically stacked devices.

Figure 2:
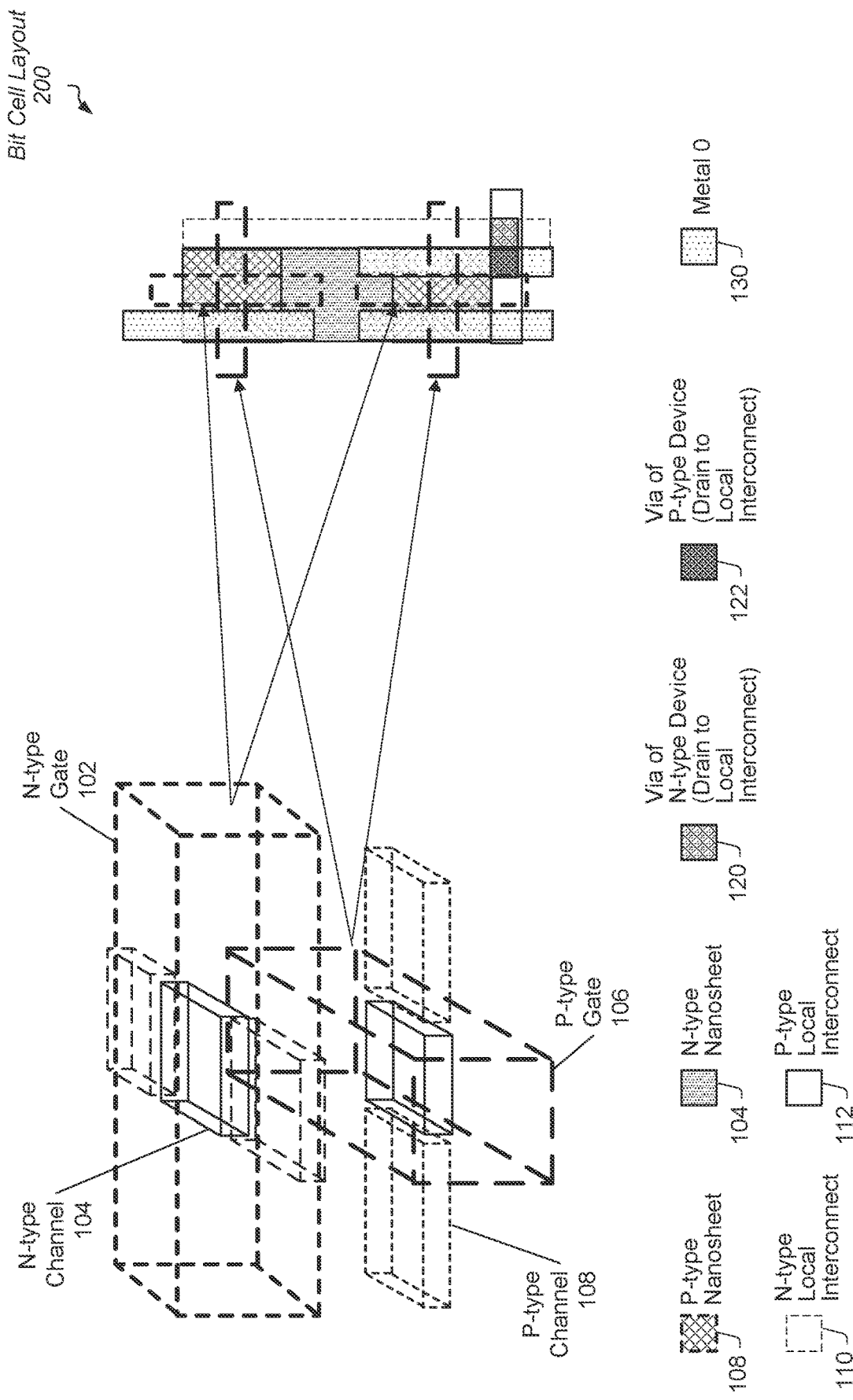
FIG. 2 is a generalized diagram of a top view of standard cell layout utilizing Cross FETs.

Turning now to FIG. 2, a generalized block diagram of a top view of a standard cell layout 200 is shown. The standard cell layout 200 is for a 2-input Boolean NAND gate using Cross FETs. A three-dimensional (3-D) illustration of the p-type and n-type Cross FETs accompanies the layout 200. Contacts (or vias), materials and structures described earlier are numbered identically. As shown, an n-type device is vertically stacked on a p-type device. Similar to the layout 100, in other implementations, the Cross FETs of the layout 200 use multiple n-type channels 104 and multiple p-type channels 108. Similar to the layout 100, the layout 200 uses an orthogonal orientation between the n-type channel 104 and the p-type channel 108, and uses a single via layer to create connections between the vertically stacked devices.

In contrast to Fin field effect transistors (Fin FETs), where a Fin of doped silicon has physical contact with the silicon substrate, the channels of vertical GAA devices do not have physical contact with the silicon substrate. Generally, when compared to Fin FETs, GAA transistors provide lower threshold voltages, faster switching times, less leakage currents, and further reduction of short channel effects. In some implementations, a channel of doped silicon of the GAA transistor is a nanowire. In other implementations, a channel of doped silicon of the GAA transistor is a nanosheet. A nanosheet is a sheet of doped silicon, rather than a wire of doped silicon. In other words, the nanosheet is a wider and thicker conductive wire than a lateral nanowire. The nanosheet can also be considered as a Fin that is rotated and placed on its side vertically above the silicon substrate such that the nanosheet does not have physical contact with the silicon substrate. Rather, metal gate is formed between the nanosheet and the silicon substrate. This visualization, though, does not describe the actual fabrication steps for forming the nanosheet.

Vertically stacking a top GAA transistor on top of a bottom GAA transistor further increases performance, reduces power consumption, reduces on-die area consumed by the GAA transistors, and further reduces short channel effects. Complementary FETs (CFETs) include a top GAA transistor vertically stacked on top of a bottom GAA transistor with at least an oxide layer in between for isolation. However, CFETs uses a top GAA transistor with one or more channels aligned in a same direction as the one or more channels of the bottom GAA transistor. As shown earlier, Cross FETs, though, have an orthogonal orientation between the one or more channels of the top GAA transistor and the one or more channels of the bottom GAA transistor. Compared to Complementary FETs, Cross FETs have better mobility for each of the top GAA transistor and the bottom GAA transistor, which leads to higher performance. Complementary FETs use two metal layers and three via layers to create connections between the top GAA transistor and the bottom GAA transistor. In contrast, Cross FETs utilize a single metal layer and a single via layer for connections between the top and bottom GAA transistors. Cross FETs have the bottom GAA transistor formed in a first wafer while the top GAA transistor is formed in a second wafer using conventional semiconductor fabrication steps. The first wafer and the second wafer are connected to one another through a hybrid bond process, which increases yield.

Figure 3:
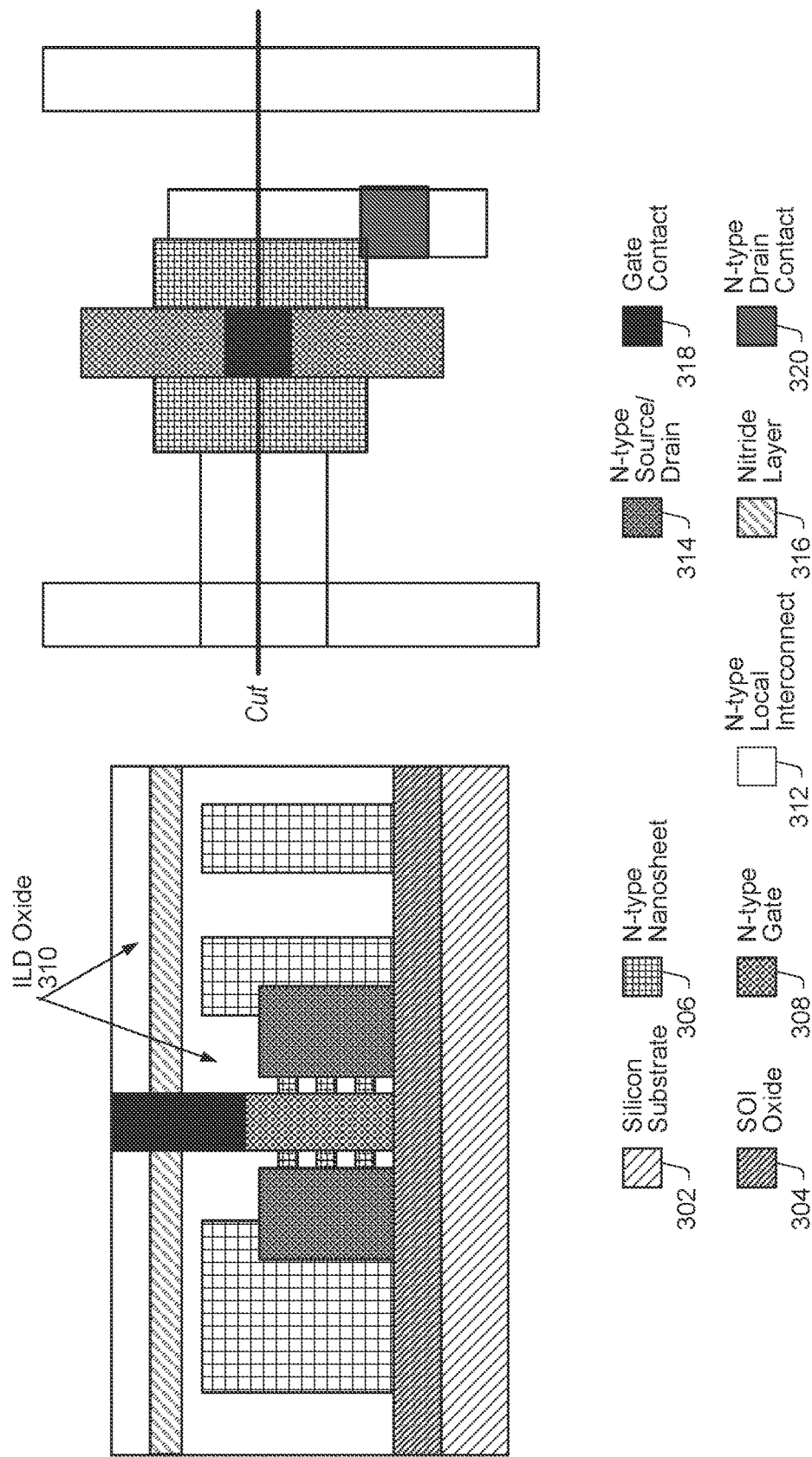
FIG. 3 is a generalized diagram of a top view of standard cell layout utilizing Cross FETs.
Figure 4:
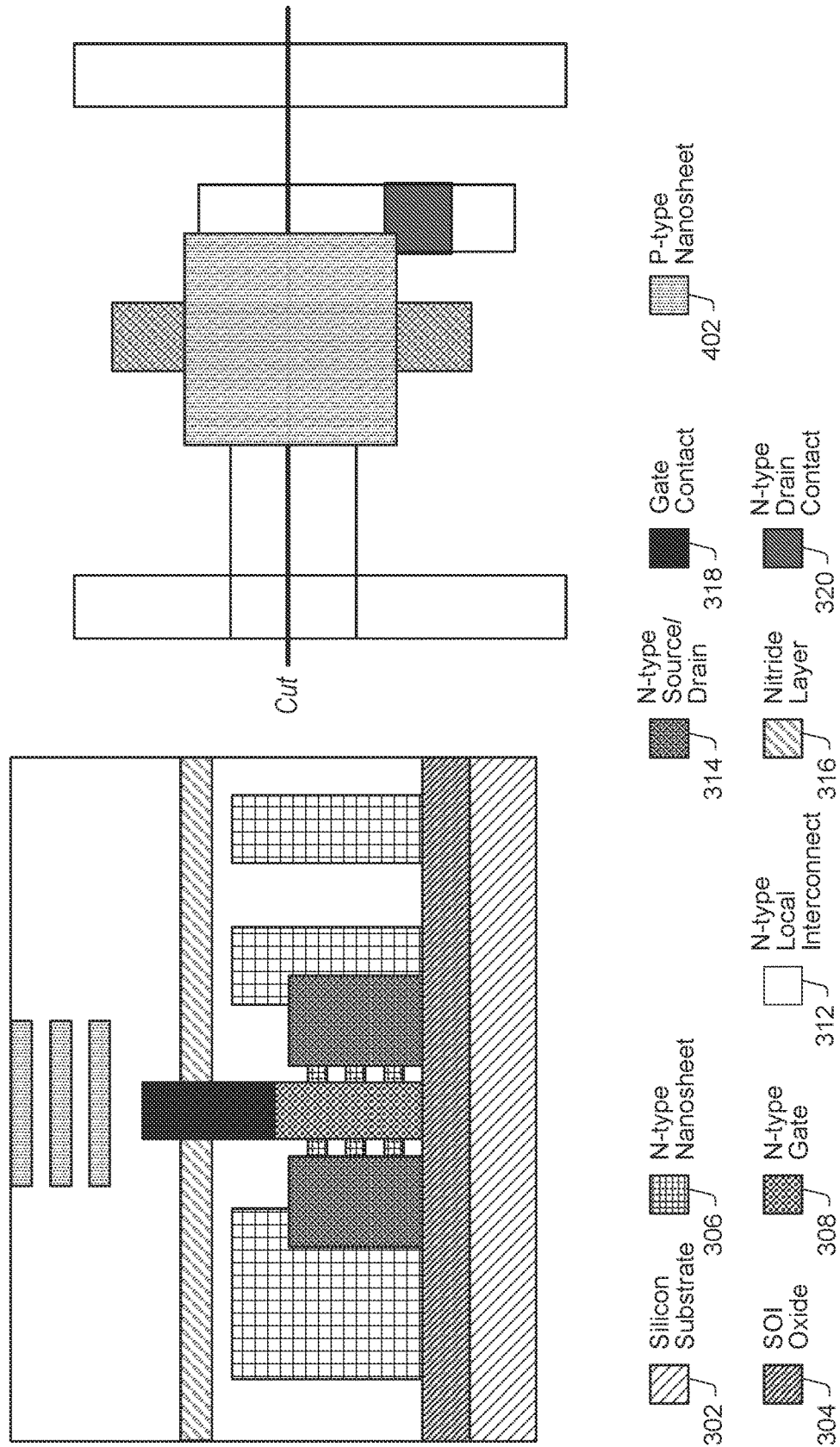
FIG. 4 is a generalized diagram of a top view of standard cell layout utilizing Cross FETs.
Figure 5:
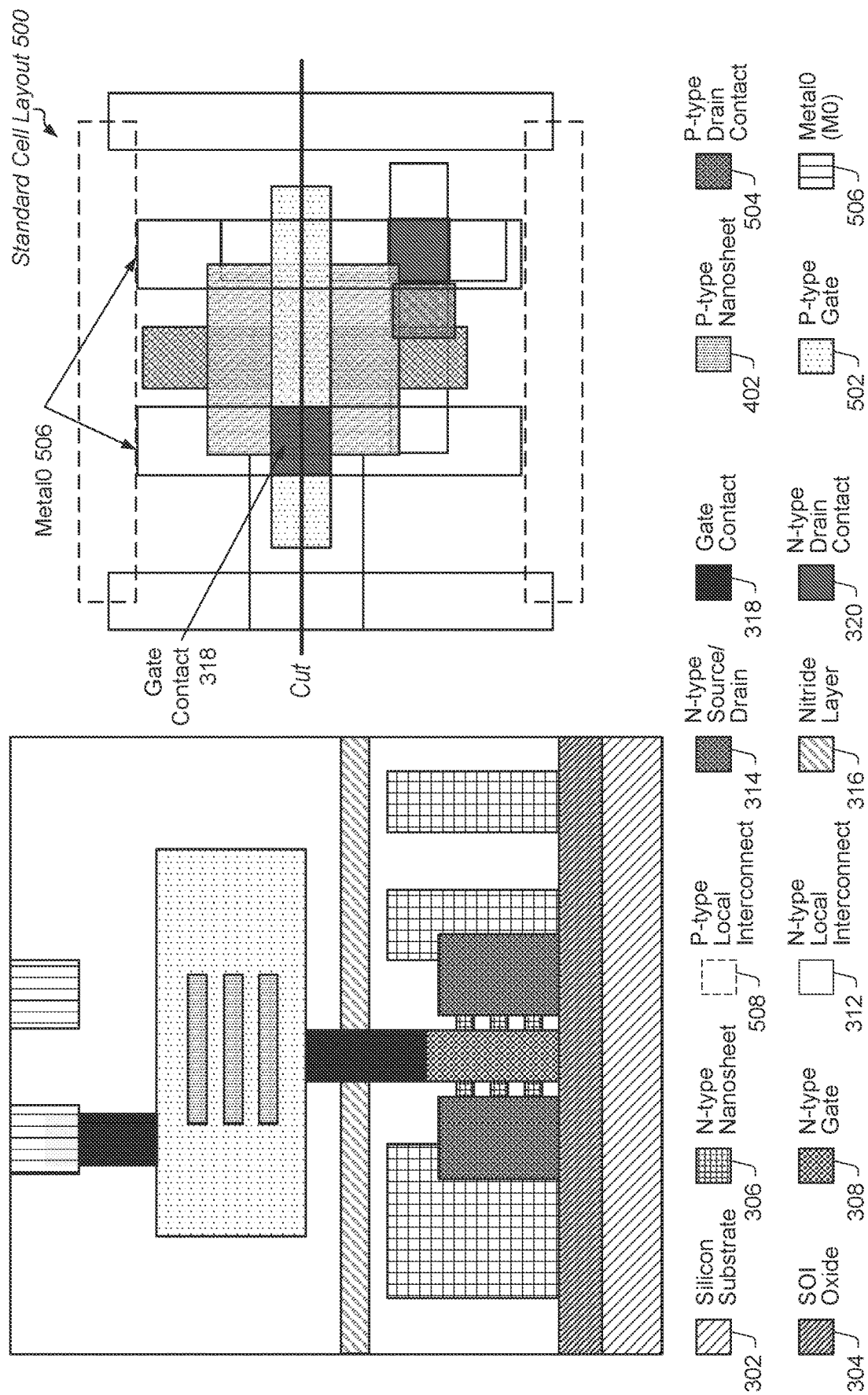
FIG. 5 is a generalized diagram of a top view of standard cell layout utilizing Cross FETs.
Figure 6:
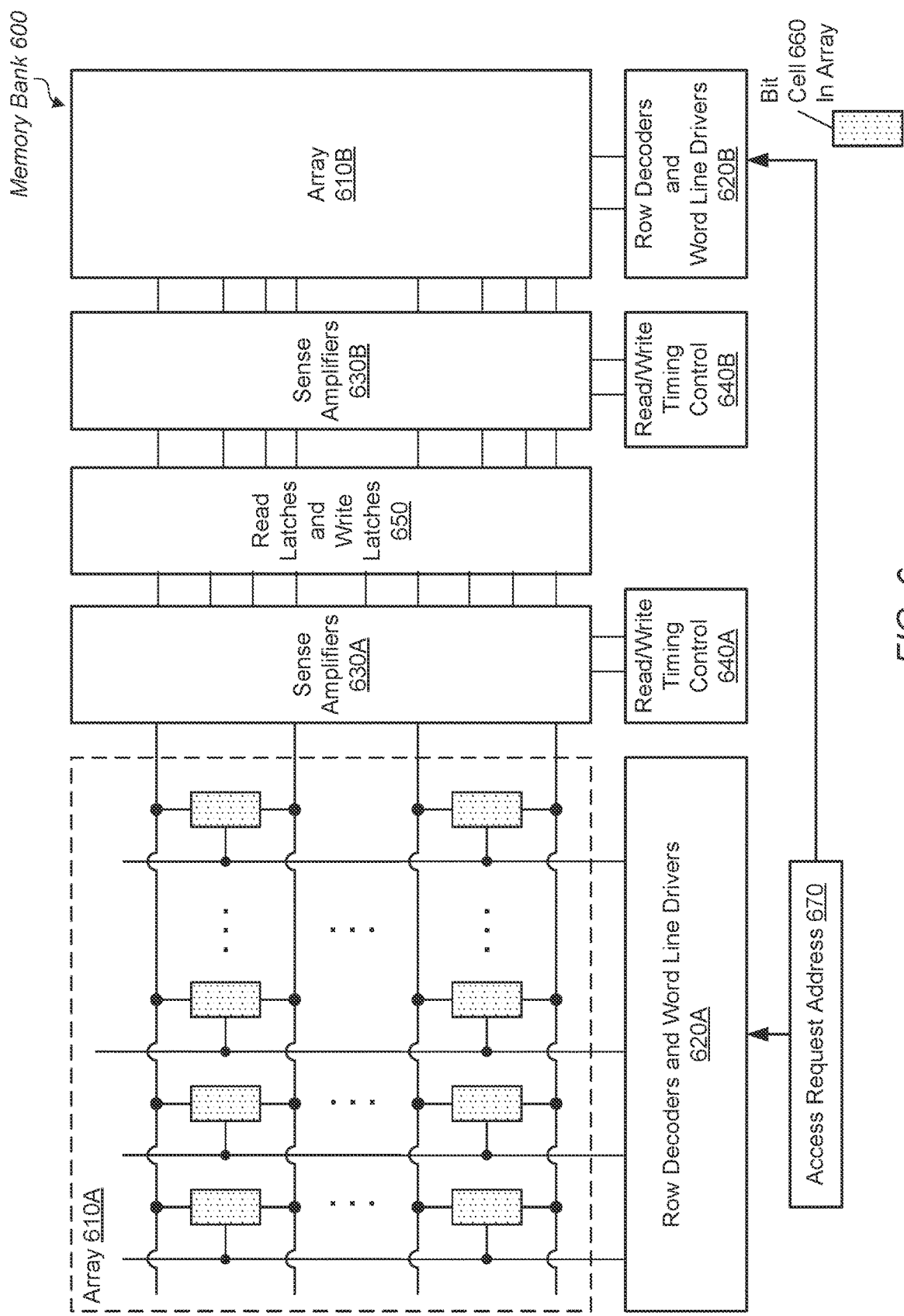
FIG. 6 is a generalized diagram of a memory bank.

In the following description, layout techniques for forming an inverter are shown in FIGS. 3-5. These techniques are also used for forming a six transistor (6T) random access data storage of a memory bit cell that consumes a planar area above a silicon substrate of four transistors. This memory bit cell that uses Cross FETs is used in a memory bank as shown in FIG. 6. The layout techniques for forming the 6T random access data storage of the memory bit cell are shown in FIGS. 7-15.

Turning now to FIG. 3, a generalized block diagram of a top view of a standard cell layout 300 is shown. The top view of the layout 300 is shown on the right, and the cross-sectional view is shown on the left. For this inverter, a p-type device is being vertically stacked on an n-type device. However, in other implementations, it is possible and contemplated to have an n-type device vertically stacked on a p-type device. Each of the devices of the inverter uses gate all around (GAA) metal that wraps around one or more nanosheets in the gate region in a 360-degree manner. The bottom n-type device is fabricated on a first wafer. The top p-type device is fabricated on a separate second wafer, which is then bonded to the first wafer as described later.

Here, in layout 300, a silicon on insulator (SOI) oxide layer 304 is deposited on the silicon substrate 302. In various implementations, the SOI oxide layer 304 is a silicon dioxide ($SiO_2$) layer. The semiconductor device fabrication process is building a local silicon on insulator (SOI) which insulates the body of the device from the silicon substrate 302. In an implementation, the formed SOI oxide layer 304 is relatively thick. A stack of channels is formed over the SOI oxide layer 304. In an implementation, the stack of channels are n-type nanosheets 306. Gate metal material 308 is deposited followed by CMP steps to polish the gate metal 308. In various implementations, titanium nitride (TiN) is used for the gate metal 308. The gate metal 308 is provided all around the n-type nanosheets 306 in a 360-degree manner. An interlayer dielectric (ILD) oxide layer 310 is deposited around the gate region.

The n-type source and drain regions 314 are formed. In an implementation, the n-type source and drain regions 314 are epitaxially grown silicon doped with Phosphorous. Afterward, the n-type local interconnect 312 is formed. In some implementations, n-type local interconnect 312 includes the tungsten, cobalt, ruthenium, or molybdenum. A silicon nitride layer 316 and additional ILD oxide 310 are formed on the initial ILD oxide 310 layer. For example, a silicon nitride (SiNx) layer 316 is deposited on the ILD oxide 310 layer. The chemical and electrical properties of amorphous hydrogenated silicon nitride (SiNx) make this material a good candidate for an insulating layer in integrated circuits. Each of the nitride layer 316 and the ILD oxide 310 layer are etched to create space for the gate contact 318. Similarly, the nitride layer 316 and the ILD oxide 310 layer are etched to create space for the drain contact 320. The gate contact 318 and the drain contract 320 are deposited in the created spaces.

Referring to FIG. 4, a generalized block diagram of a top view of a standard cell layout 400 is shown. Contacts (or vias), materials and other layout elements described earlier are numbered identically. The standard cell layout 400 (or layout 400) on the right is a continuation of the semiconductor processing steps being performed on the layout 300 for an inverter using Cross FETs. A cross-sectional view of the semiconductor layers used in the layout 400 also accompanies the layout 400 and it is shown on the left. A stack of channels is formed over the n-type gate contact 318 in the ILD oxide layer 310. In an implementation, the stack of channels are p-type nanosheets 402. In some implementations, a separate wafer has alternating layers grown such as a silicon germanium semiconducting epitaxial growth layer alternating with a silicon semiconducting epitaxial growth layer. The separate wafer with the alternating layers is bonded to the top of ILD oxide layer 310 of the layout 300 (of FIG. 3). In other implementations, the alternating layers are grown on top of ILD oxide layer 310 of the layout 300 followed by one of the earlier named processes for etching the layers to the size of the p-type nanosheets 402. The earlier named processes were described in relation to forming the n-type nanosheets 306.

Turning now to FIG. 5, a generalized block diagram of a top view of a standard cell layout 500 is shown. Contacts (or vias), materials and other layout elements described earlier are numbered identically. The standard cell layout 500 (or layout 500) on the right is a continuation of the semiconductor processing steps being performed on the layout 400 for creating an inverter using Cross FETs. A cross-sectional view of the semiconductor layers used in the layout 500 also accompanies the layout 500 and it is shown on the left. The ILD oxide 310 layer is etched to create space for the p-type gate 502, which is placed all around the p-type nanosheets 402. Similarly, the ILD oxide 310 layer is etched to create space for the drain contact 504. The gate contact 318 and the drain contract 504 are deposited in the created spaces. Here, a metal zero layer (or metal0 or Metal 0 or M0) 506 is deposited for creating further connections for the inverter. It is noted that the metal zero layer 506 is also referred to by different names in order to maintain a convention of using the metal zero layer as a horizontal layer such as in the next layer up.

Turning now to FIG. 6, a generalized block diagram of one implementation of a memory bank 600 is shown. In various implementations, a memory is organized as multiple memory banks, and a memory macro block includes both a left bank and a right bank. In some implementations, the bank 600 is one of the left bank or the right bank of the memory macro block. Although "left" and "right" are used to describe the memory banks, other notations may be used such as a "top bank" and a "bottom bank." As shown, the memory bank 600 includes arrays 610A-610B, row decoders 620A-620B, sense amplifiers 630A-630B between the arrays 610A-610B, read and write timing control logic 640A-640B, and read latches and write latches in block 650. It is noted that, in some implementations, multiple banks are accessed concurrently in a same clock cycle or a same pipeline stage. The access includes one of a read access and a write access. In such implementations, bank address decoders select the corresponding banks to access.

In various implementations, each of the blocks 610A-610B, 620A-620B, 630A-630B, 640A-640B and 650 in the memory bank 600 is communicatively coupled to another one of the blocks. For example, direct connections are used wherein routing occurs through another block. Alternatively, staging of signals is done in an intermediate block. In various implementations, each of the arrays 610A-610B includes multiple memory bit cells 660 (or bit cells 66) arranged in a tiled format. Here, the rows are aligned with the tracks used for the routing of the word lines of the array such as in the vertical direction in the illustrated implementation. The columns are aligned with the tracks used for the routing of the bit lines of the array such as in the horizontal direction in the illustrated implementation. In other implementations, the rows and columns are rotated and have a different orientation.

The row decoders and word line drivers in blocks 620A-620B receive address information corresponding to an access request. For example, each of the blocks 620A-620B receives the information provided by the access request address 670. Each one of the blocks 620A-620B selects a particular row, or entry, of the multiple rows in an associated one of the arrays 620A-620B. In some implementations, the blocks 620A-620B use an index portion of the address 670 for selecting a given row, or entry, in an associated one of the arrays 620A-620B. Each row, or entry, stores one or more memory lines.

In the implementation shown, the rows, or entries, in the arrays 620A-620B are arranged in a vertical orientation. However, in other implementations, a horizontal orientation is used for storage of the memory lines. For write access requests, the write latches are located in block 650. The write data is driven into the arrays 610A-610B. The timing control logic 640A-640B updates the write latches with new data in block 650 and sets up the write word line driver logic. The write data is written into a row of bit cells that is selected by an associated one of the blocks 620A-620B. In some implementations, pre-charge circuitry is included in block 650.

For read access requests, the block 650 is used to pre-charge the read bit lines routed to the arrays 610A-610B. The timing circuitry in blocks 640A-640B is used for pre-charging and setting up the sense amplifiers in the blocks 630A-630B. The timing circuitry 640A-640B sets up the read word line driver logic. One of the row decoders 620A-620B selects a row to read out data, which will be provided on read bit lines that are sensed by the sense amplifiers. The read latches capture the read data.

In various implementations, the memory bit cell 660 (or bit cell 660) utilizes a six transistor (6T) random access data storage. For example, data storage uses a back-to-back configuration of two inverters. In some implementations, one or more of the inverters is a tristate inverter. In some implementations, the bit cell 660 uses double-ended write circuitry, whereas, in other implementations, the bit cell 660 uses single-ended write circuitry. The bit cell 660 also includes one or more read access circuits. In various implementations, the memory bit cell 660 (or bit cell 660) utilizes the data storage circuit configuration of bit cell 700 (of FIG. 7) and the layout techniques of cell layout 800-1500 (of FIGS. 8-15) in the upcoming description.

Figure 7:
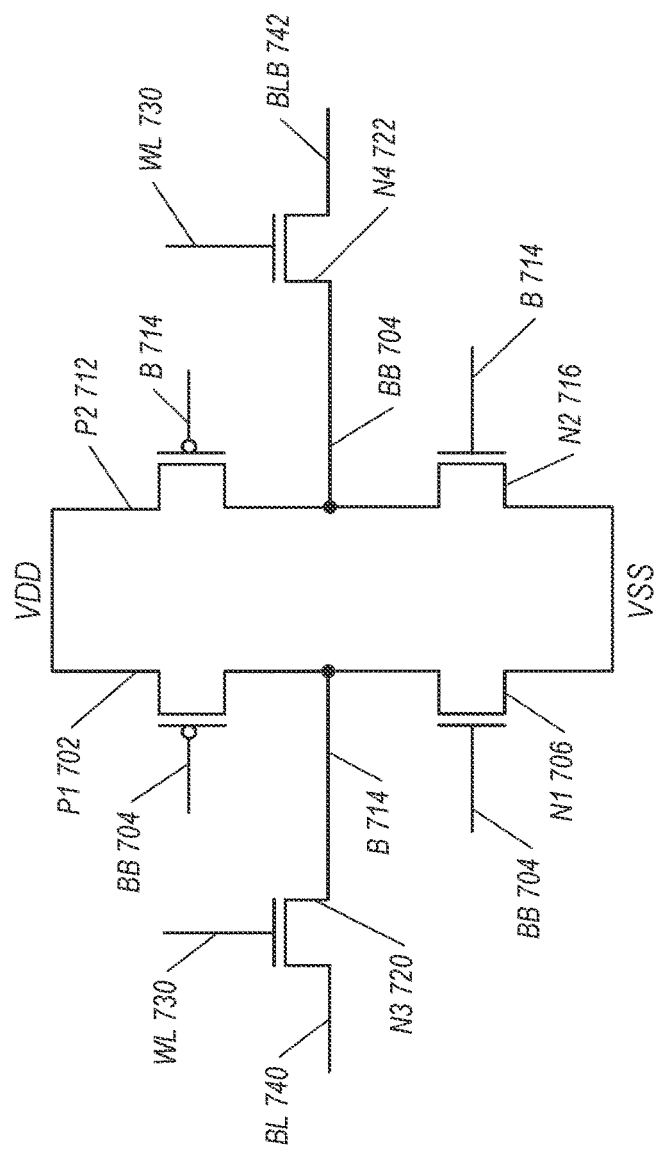
FIG. 7 is a generalized diagram of data storage circuitry of a memory bit cell.

Turning to FIG. 7, a generalized block diagram of one implementation of data storage of a memory bit cell 700 is shown. In the implementation shown, data storage by a latching element is provided by the devices P1 702, N1 706, P2 712 and N2 716. These devices provide data storage using a back-to-back configuration of two inverters. As used herein, a Boolean logic high level is also referred to as a logic high level. Similarly, a Boolean logic low level is also referred to as a logic low level. In various implementations, the logic high level is equal to a power supply reference voltage level and the logic low level is equal to a ground reference voltage level. As used herein, a circuit node or line is "asserted" when the node or line stores a voltage level that enables a transistor that receives the voltage level, or the voltage level indicates an operation is enabled. For example, an n-type transistor is enabled when the n-type transistor receives a positive non-zero voltage level on its gate terminal that is at least a threshold voltage above a voltage level on its source terminal.

As used herein, the circuit node or line is "negated" when the node or line stores a voltage level that disables a transistor that receives the voltage level. An n-type transistor is disabled when the n-type transistor receives a voltage level on its gate terminal that is within a threshold voltage of a voltage level on its source terminal. Similarly, a p-type transistor is enabled when the p-type transistor receives a voltage level on its gate terminal that is at least a threshold voltage below a voltage level on its source terminal. The p-type transistor is negated when the p-type transistor receives a voltage level on its gate terminal that is within a threshold voltage of a voltage level on its source terminal. Additionally, operations are enabled and disabled based on corresponding control signals being asserter or negated.

When a write operation is occurring, external circuitry (not shown) asserts the write word line WL 730 with a logic high level. Accordingly, each of the n-type transistors N3 720 and N4 722 is enabled. The enabled transistors 720 and 722 of the pass gate electrically connect the bit line BL 740 to the node B 714. Therefore, the bit line BL 740 drives a voltage level to be stored on the node B 714. One of the transistors P2 712 and N2 716 is enabled based on the voltage level of the node B 714. Similarly, one of the transistors P1 702 and N1 706 is enabled based on the node BB 704, which is the output node between the two transistors P2 712 and N2 716.

When a write operation is not occurring, external circuitry (not shown) negates the write word line WL 730 with a logic low level. Accordingly, each of the n-type transistors N3 720 and N4 722 is disabled. The data storage of the memory bit cell 700 is one implementation of a static RAM (SRAM). In other implementations, another one of various types of RAM cells is used. This "memory bit cell" may also be referred to as the "memory bit cell," the "SRAM bit cell," and "bit cell." In various implementations, the memory bit cell 700 is copied many times and arranged in rows and columns of a memory array as shown earlier in memory bank 600 (of FIG. 6).

Figure 8:
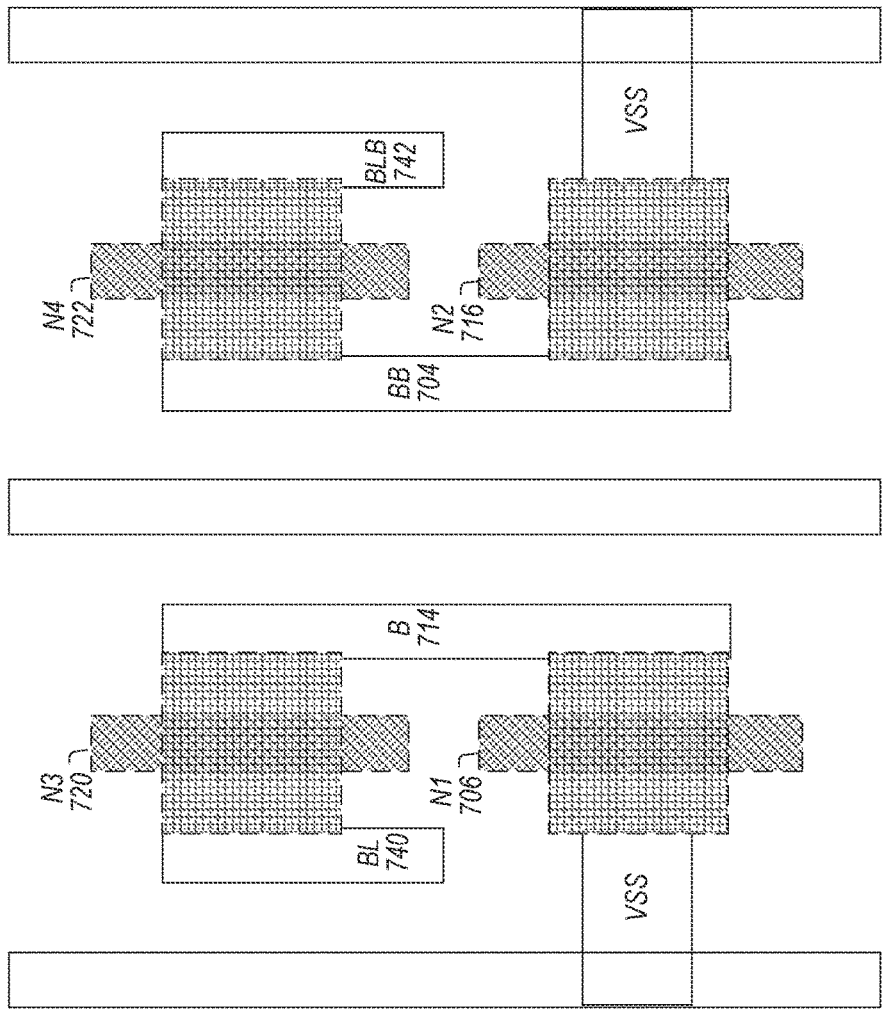
FIG. 8 is a generalized diagram of a top view of memory bit cell layout utilizing Cross FETs.

In the following description, the layout 800-1200 (of FIGS. 8-12) describe steps for forming the n-type devices, whereas, the layout 1300-1500 (of FIGS. 13-15) describe steps for forming the p-type devices. Contacts (or vias), materials and other layout elements described earlier are numbered identically in FIGS. 8-15. Turning now to FIG. 8, a generalized block diagram of a top view of layout 800 of data storage circuitry of a memory bit cell is shown. For this bit cell, a p-type device is being vertically stacked on an n-type device. However, in other implementations, it is possible and contemplated to have an n-type device vertically stacked on a p-type device. Each of the devices of the memory bit cell uses gate all around (GAA) metal that wraps around one or more nanosheets in the gate region in a 360-degree manner. The bottom n-type device is fabricated on a first wafer. The top p-type device is fabricated on a separate second wafer, which is then bonded to the first wafer as described later.

Figure 9:
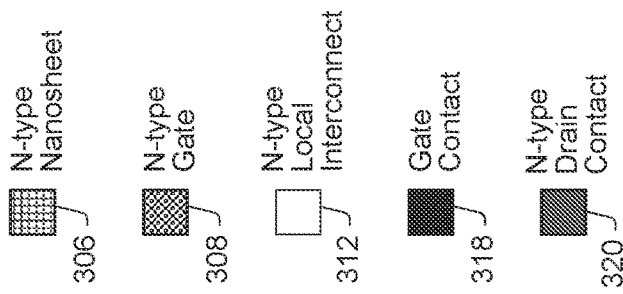
FIG. 9 is a generalized diagram of a top view of memory bit cell layout utilizing Cross FETs.
Figure 9:
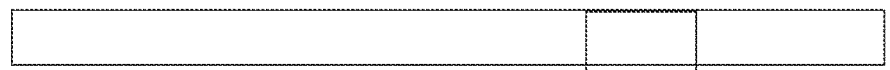
Figure 9:

Here, in layout 800, a stack of channels is formed as described earlier. In an implementation, the stack of channels are n-type nanosheets 306. Gate metal material 308 is deposited. The gate metal 308 is provided all around the n-type nanosheets 306 in a 360-degree manner. An interlayer dielectric (ILD) oxide layer 310 is deposited around the gate region. Afterward, the n-type local interconnect 312 is formed. The signal names used in the bit cell 700 are shown here to aid the description of the forming of the layout for the data storage circuitry of the memory bit cell. In the layout 900 of FIG. 9, isolation layers, such as the nitride layer 316 and the ILD oxide layer 310 (not shown), are etched to create space for the gate contact 318 and the drain contact 320. The gate contacts 318 and the drain contracts 320 are deposited in the created spaces.

Figure 10:
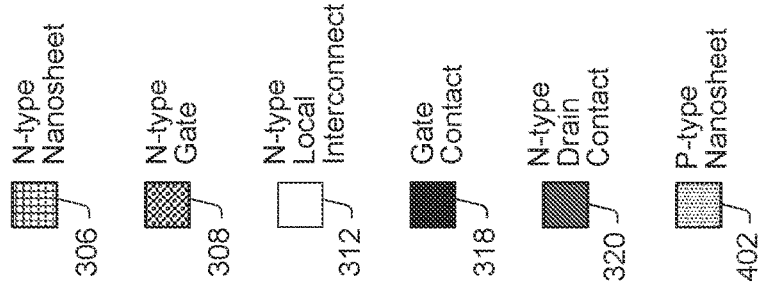
FIG. 10 is a generalized diagram of a top view of memory bit cell layout utilizing Cross FETs.
Figure 10:
Figure 10:
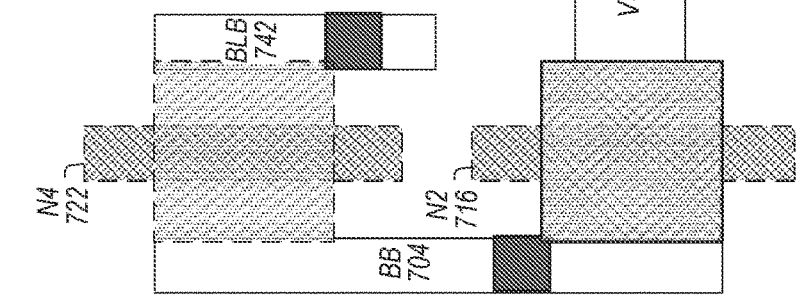
Figure 10:
Figure 10:
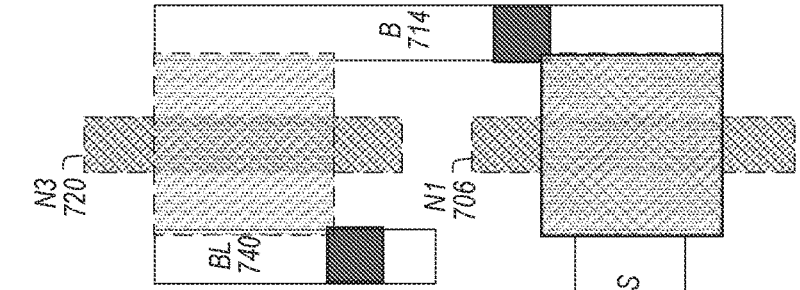
Figure 10:
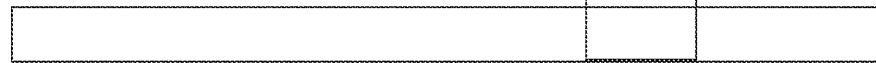
Figure 11:
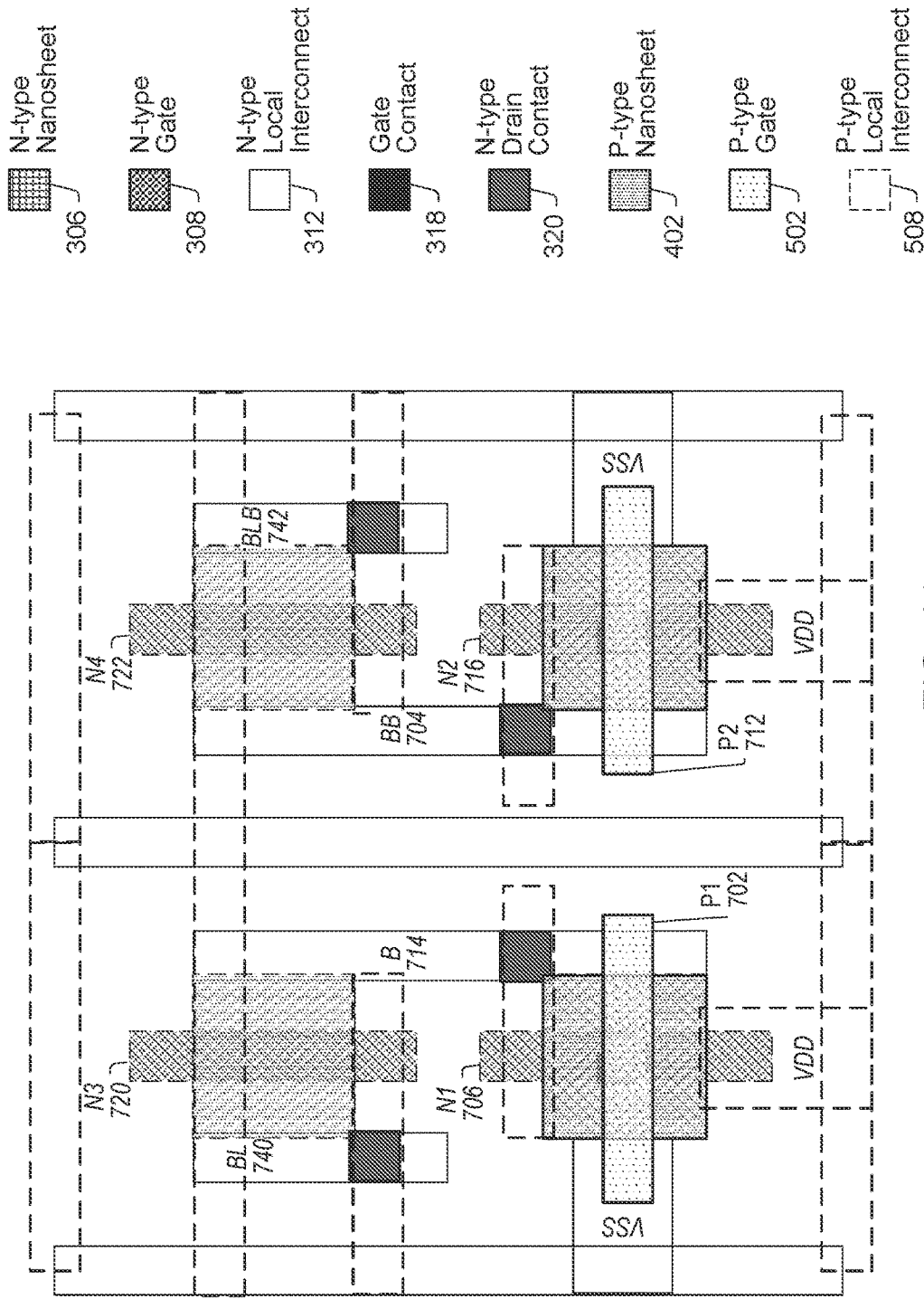
FIG. 11 is a generalized diagram of a top view of memory bit cell layout utilizing Cross FETs.
Figure 12:
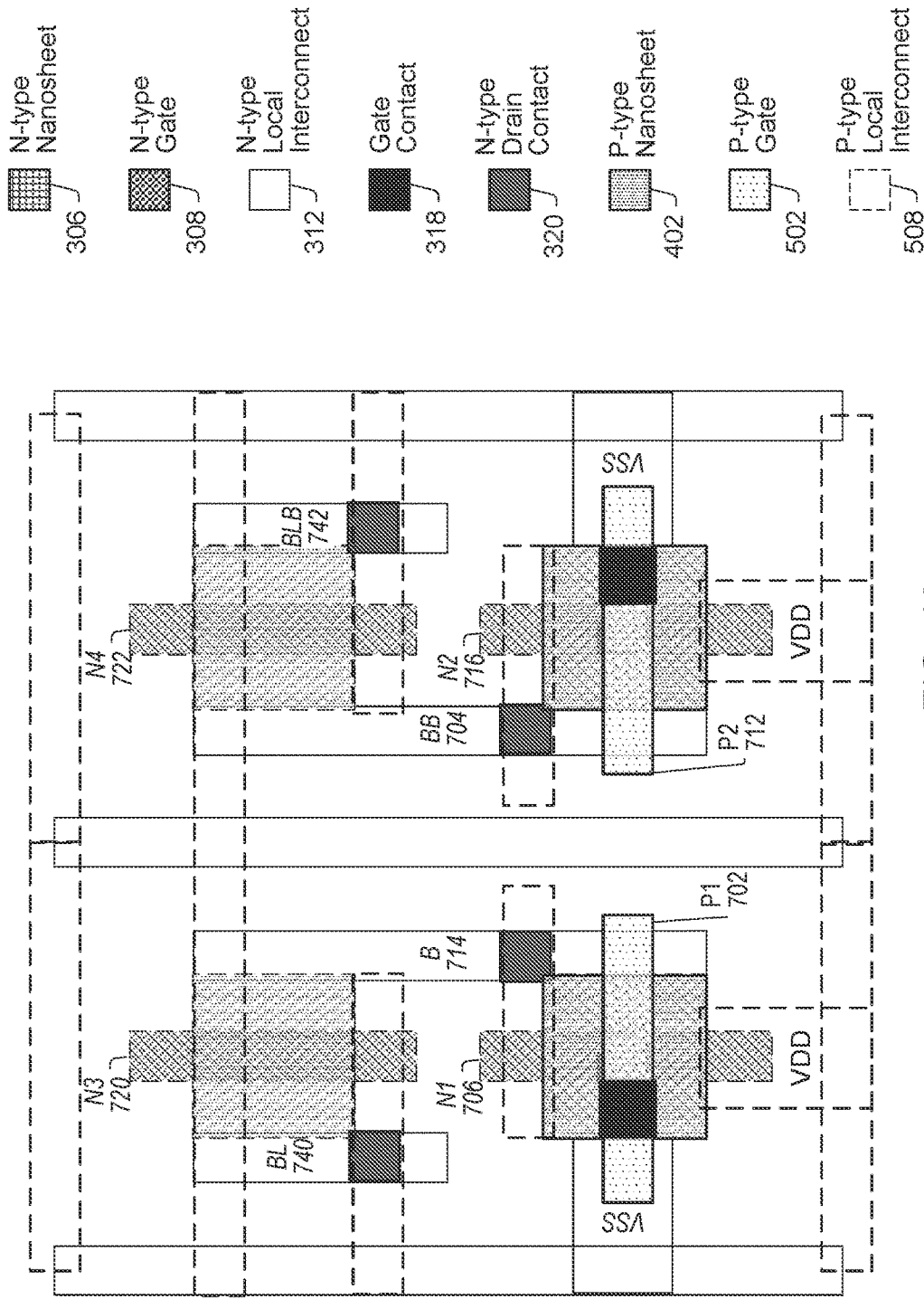
FIG. 12 is a generalized diagram of a top view of memory bit cell layout utilizing Cross FETs.
Figure 13:
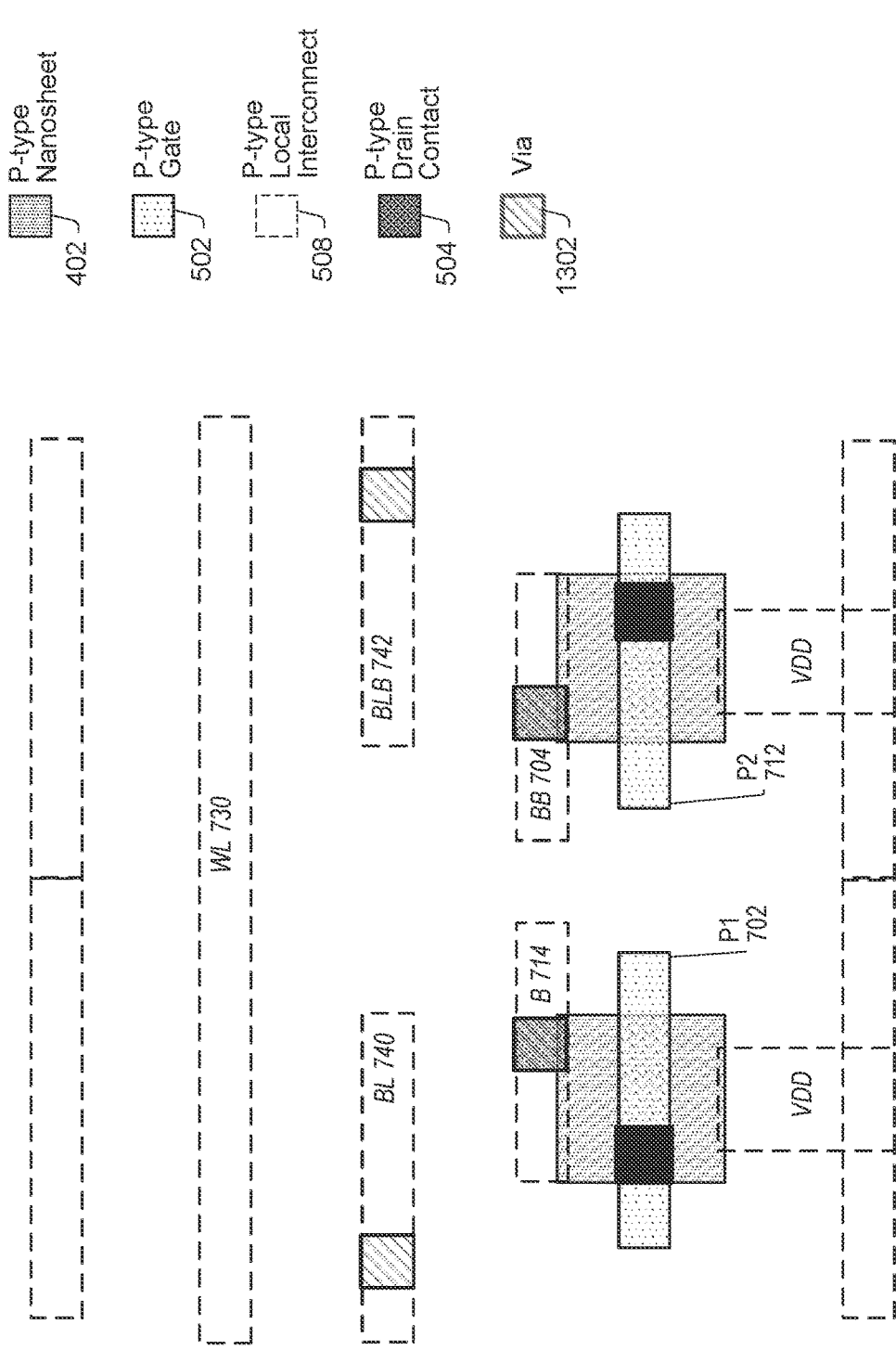
FIG. 13 is a generalized diagram of a top view of memory bit cell layout utilizing Cross FETs.
Figure 14:
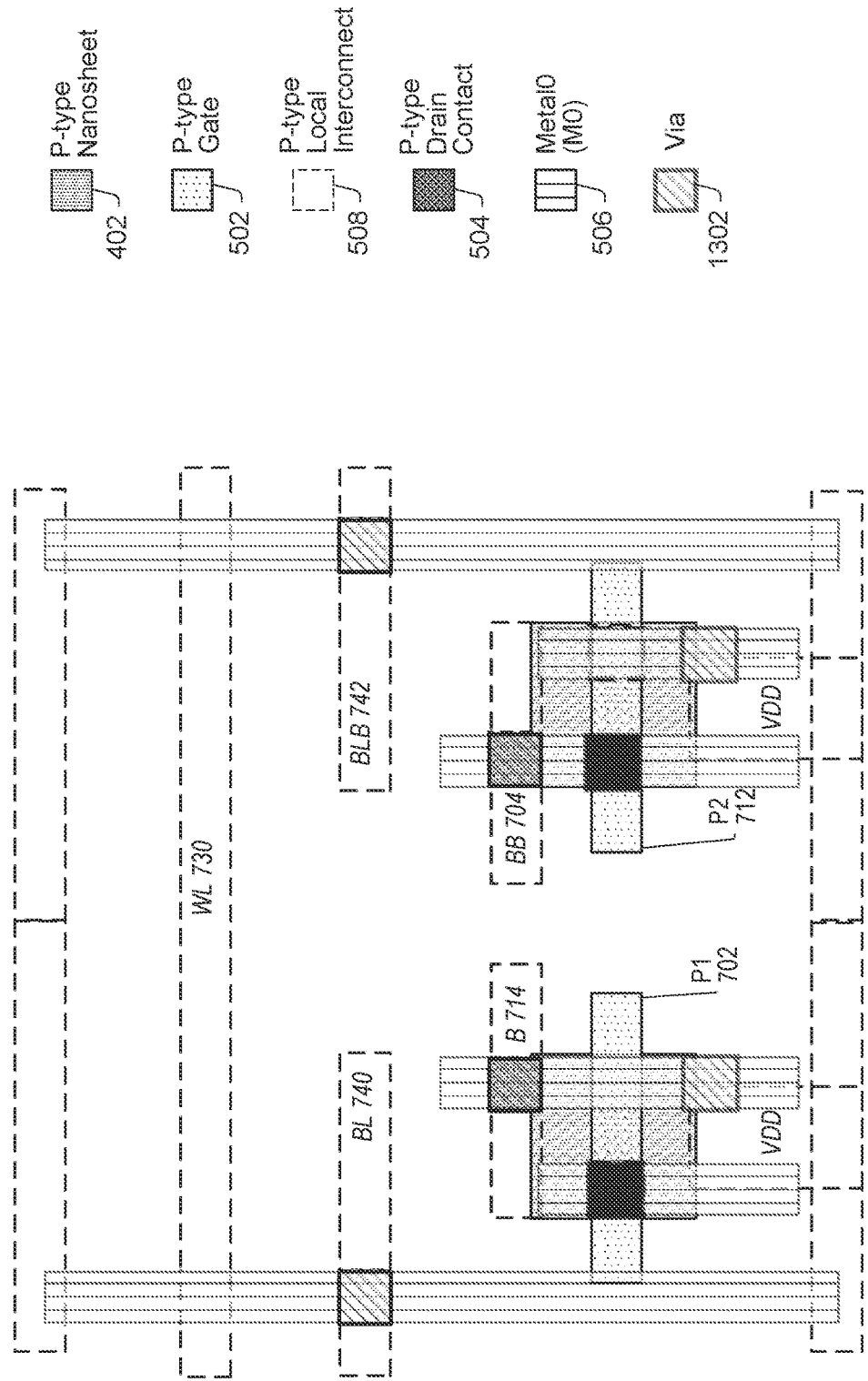
FIG. 14 is a generalized diagram of a top view of memory bit cell layout utilizing Cross FETs.
Figure 15:
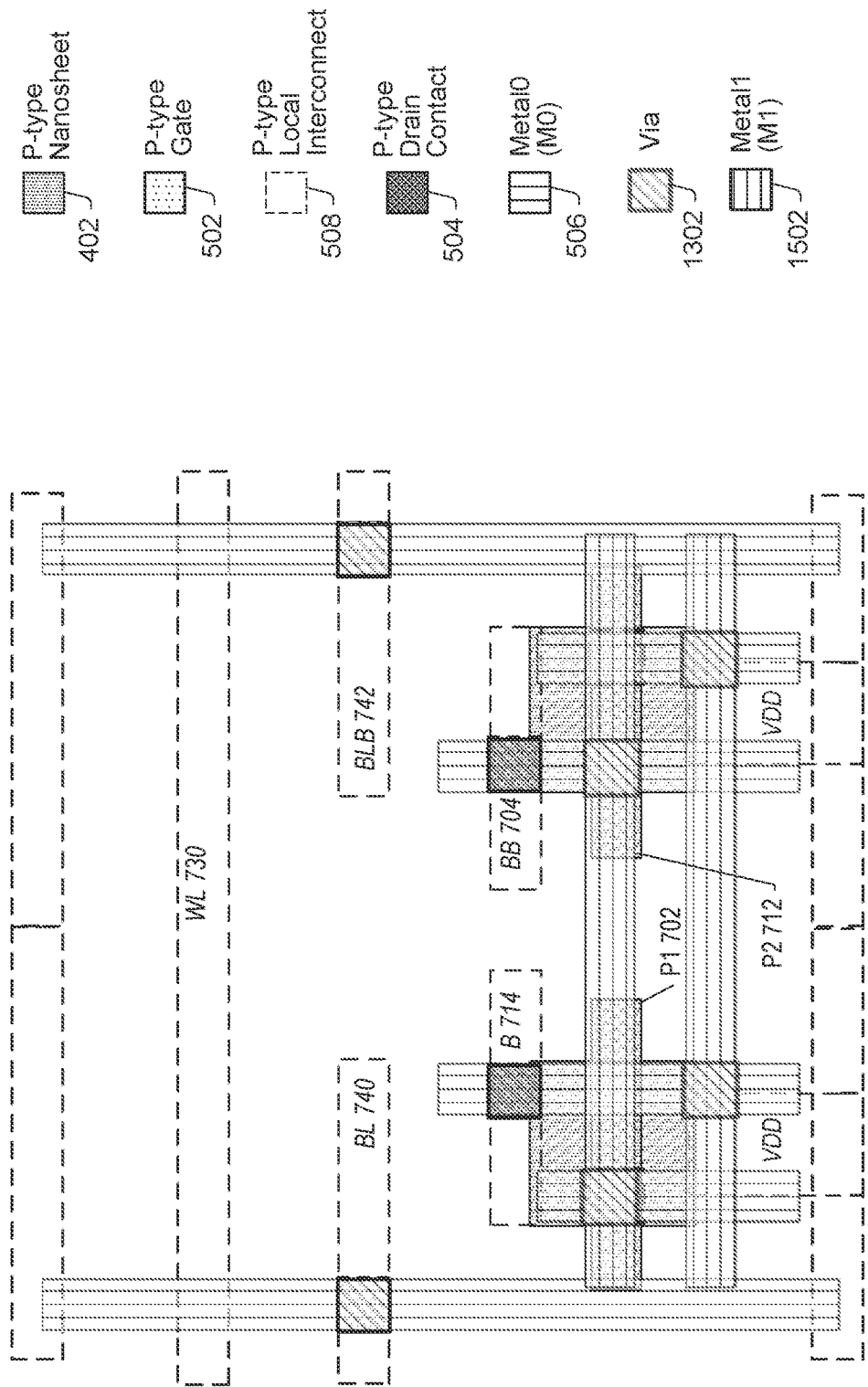
FIG. 15 is a generalized diagram of a top view of memory bit cell layout utilizing Cross FETs.

In the layout 1000 of FIG. 10, a stack of channels, which are p-type nanosheets 402, is formed over the n-type gate contact 318. In the layout 1100 of FIG. 11, an insulation layer, such as the ILD oxide 310 layer (not shown) is etched to create space for the p-type gate 502, which is placed all around the p-type nanosheets 402. Afterward, in the layout 1200 of FIG. 12, the p-type local interconnect 508 is formed. For ease of illustration, the layout 1300 of FIG. 13 (and layout 1400-1500 of FIGS. 14-15) shows the materials used for the p-type devices formed vertically above the n-type devices. In the layout 1300, additional contacts and vias are formed such as the p-type drain contacts 504 and the vias 1302 used to create physical connections of the p-type local interconnect layer 508. In the layout 1400, a metal zero layer (or metal0 or Metal 0 or M0) 506 is deposited for creating further connections for the bit cell. It is noted that the metal zero layer 506 is also referred to by different names in order to maintain a convention of using the metal zero layer as a horizontal layer such as in the next layer up. In the layout 1500, a metal one layer (or metal1 or Metal 1 or M1) 1502 is deposited for creating even further connections for the bit cell.

Figure 16:
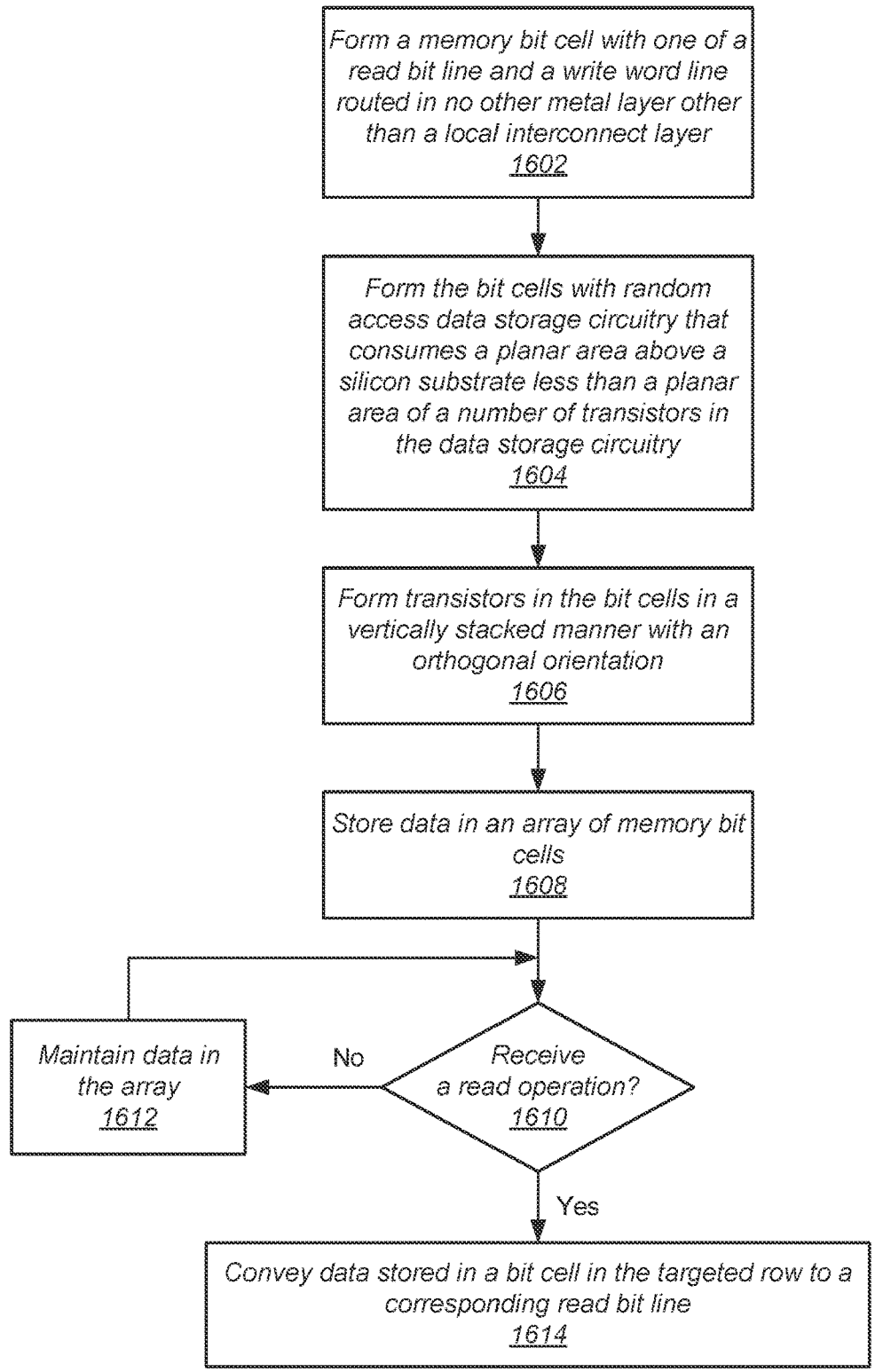
FIG. 16 is a generalized diagram of one embodiment of a method for efficiently creating layout for memory bit cells that utilize Cross FETs.

Referring now to FIG. 16, one embodiment of a method 1600 for efficiently creating layout for memory bit cells is shown. For purposes of discussion, the steps in this embodiment are shown in sequential order. However, in other embodiments some steps occur in a different order than shown, some steps are performed concurrently, some steps are combined with other steps, and some steps are absent.

A semiconductor fabrication processor (or process) forms a memory bit cell with one of a read bit line and a write word line routed in no other metal layer other than a local interconnect layer (block 1602). Therefore, signal congestion is reduced, since upper-level metal layers are not used to route one or more of these signals. For example, in some implementations, the write word line is routed in in no other metal layer other than a local interconnect layer, whereas, the read bit line (and the complemented version of the read bit line) is additionally routed in a metal zero layer above the local interconnect layer. In another implementation where the memory bit cell is rotated 90 degrees, it is possible to have the opposite scenario where the read bit line is routed in in no other metal layer other than a local interconnect layer, whereas, the write word line is additionally routed in a metal zero layer above the local interconnect layer. In each scenario, only one of the read bit line and the write word line is routed in no other metal layer other than a local interconnect layer. The process forms the bit cells with random access data storage circuitry that consumes a planar area above a silicon substrate less than a planar area of a number of transistors in the data storage circuitry (block 1604). For example, circuitry of a six transistor (6T) random access data storage of the given memory bit cell consumes a planar area above a silicon substrate of four transistors.

The process forms transistors in the bit cells in a vertically stacked manner with an orthogonal orientation (block 1606). These vertically stacked transistors cause the circuitry of the random access data storage to consume less planar area than a planar area of a number of transistors used in the circuitry of the data storage. An array of these memory bit cells arranged as multiple rows and columns stores data (block 1608). In various implementations, the values of the stored data are maintained by data storage loops within the memory bit cells. In addition, the values of the stored data are updated by write operations.

If the array does not receive a read operation ("no" branch of the conditional block 708), then each of the bit cells maintains a stored binary value (block 1612). For example, each of the bit cells includes a latch element for storing the binary value until the binary value is modified by a write access operation. If the array receives a read operation ("yes" branch of the conditional block 1612), then a bit cell in a row targeted by the read operation conveys data stored in the bit cell to a corresponding read bit line (1614).

Figure 17:
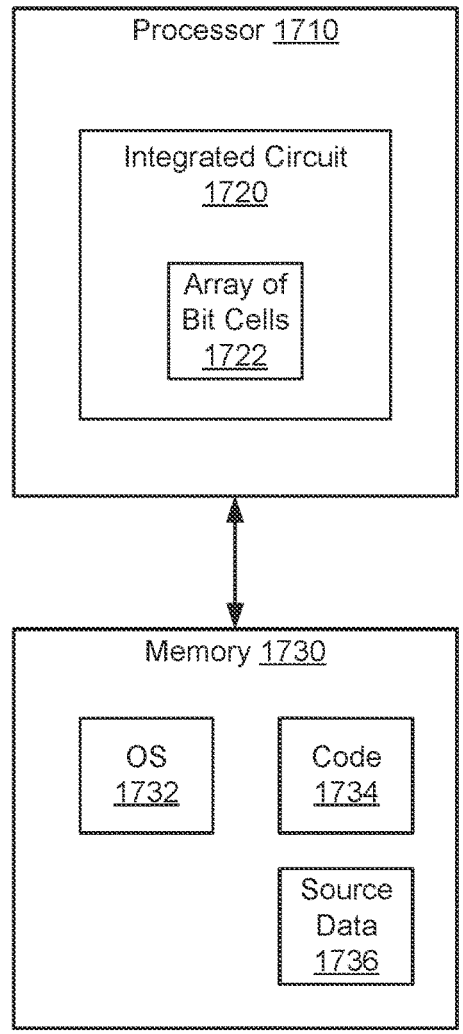
FIG. 17 is a generalized diagram of computing system with an integrated circuit that uses an array of memory bit cells that utilize Cross FETs.

Referring to FIG. 17, one embodiment of a computing system 1700 is shown. The computing system 1700 includes the processor 1710 and the memory 1730. Interfaces, such as a memory controller, a bus or a communication fabric, one or more phased locked loops (PLLs) and other clock generation circuitry, a power management unit, and so forth, are not shown for ease of illustration. It is understood that in other implementations, the computing system 1700 includes one or more of other processors of a same type or a different type than processor 1710, one or more peripheral devices, a network interface, one or more other memory devices, and so forth. In some implementations, the functionality of the computing system 1700 is incorporated on a system on chip (SoC). In other implementations, the functionality of the computing system 1700 is incorporated on a peripheral card inserted in a motherboard. The computing system 1700 is used in any of a variety of computing devices such as a desktop computer, a tablet computer, a laptop, a smartphone, a smartwatch, a gaming console, a personal assistant device, and so forth.

The processor 1710 includes hardware such as circuitry. For example, the processor 1710 includes at least one integrated circuit 1720, which utilizes Cross FETs for implementing memory bit cells in the array 1722. For example, one or more memory bit cells are instantiated in the array 1722. In some implementations, these bit cells use the circuitry of bit cell 700 (of FIG. 7) and the layout shown in cell layout 800-1500 (of FIGS. 8-15). In various implementations, the processor 1710 includes one or more processing units. In some implementations, each of the processing units includes one or more processor cores capable of general-purpose data processing, and an associated cache memory subsystem. In such an implementation, the processor 1710 is a central processing unit (CPU). In another implementation, the processing cores are compute units, each with a highly parallel data microarchitecture with multiple parallel execution lanes and an associated data storage buffer. In such an implementation, the processor 1710 is a graphics processing unit (GPU), a digital signal processor (DSP), or other.

In some implementations, the memory 1730 includes one or more of a hard disk drive, a solid-state disk, other types of flash memory, a portable solid-state drive, a tape drive and so on. The memory 1730 stores an operating system (OS) 1732, one or more applications represented by code 1734, and at least source data 1736. Memory 1730 is also capable of storing intermediate result data and final result data generated by the processor 1710 when executing a particular application of code 1734. Although a single operating system 1732 and a single instance of code 1734 and source data 1736 are shown, in other implementations, another number of these software components are stored in memory 1730. The operating system 1732 includes instructions for initiating the boot up of the processor 1710, assigning tasks to hardware circuitry, managing resources of the computing system 1700 and hosting one or more virtual environments.

Each of the processor 1710 and the memory 1730 includes an interface unit for communicating with one another as well as any other hardware components included in the computing system 1700. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
   an array of memory bit cells for storing data arranged as a plurality of rows and a plurality of columns, wherein a given memory bit cell of the array comprises a transistor stack that comprises a first transistor with a channel oriented in a first direction and a second transistor with a channel oriented in a direction orthogonal to the first direction;
   wherein in response to receiving an indication of a first read operation targeting a row of the plurality of rows comprising the given memory bit cell, the array conveys data stored in the given memory bit cell to a read bit line.

2. The integrated circuit as recited in claim 1, wherein a six transistor (6T) random access data storage of the given memory bit cell consumes a planar area above a silicon substrate of four transistors.

3. The integrated circuit as recited in claim 1, wherein a highest metal layer used for signal routing in the given memory bit cell is a metal zero layer.

4. The integrated circuit as recited in claim 1, wherein one of the read bit line and a write word line of the given memory bit cell of the array is routed in no other metal layer other than a local interconnect layer.

5. The integrated circuit as recited in claim 1, wherein the transistor stack comprises an oxide layer between the first transistor and the second transistor.

6. The integrated circuit as recited in claim 5, wherein:
   a channel comprises a nanosheet; and
   each of the first transistor and the second transistor is a vertical gate all around (GAA) device.

7. The integrated circuit as recited in claim 1, wherein the first transistor has a channel with a first doping polarity and the second transistor has a channel with a doping polarity opposite that of the first doping polarity.

8. A method comprising:
forming a transistor stack in a given memory bit cell, wherein the transistor stack comprises:
a first transistor with a channel oriented in a first direction; and
a second transistor with a channel oriented in a direction orthogonal to the first direction; and
forming an array of memory bit cells including the given memory bit cell.

9. The method as recited in claim 8, further comprising forming the given memory bit cell such that a six transistor (6T) random access data storage of the given memory bit cell consumes a planar area above a silicon substrate of four transistors.

10. The method as recited in claim 8, further comprising forming the given memory bit cell such that a highest metal layer used for signal routing is a metal zero layer.

11. The method as recited in claim 8, further comprising forming the given memory bit cell to comprise one of a read bit line and a write word line routed in no other metal layer other than a local interconnect layer.

12. The method as recited in claim 8, further comprising forming an oxide layer between the first transistor and the second transistor.

13. The method as recited in claim 12, wherein:
a channel comprises a nanosheet; and
each of the first transistor and the second transistor is a vertical gate all around (GAA) device.

14. The method as recited in claim 12, further comprising forming the given memory bit cell such that the first transistor has a channel with a first doping polarity and the second transistor has a channel with a doping polarity opposite that of the first doping polarity.

15. A computing system comprising:
a memory configured to store instructions of one or more tasks and source data to be processed by the one or more tasks;
an integrated circuit coupled to communicate with the memory via an interface, wherein the integrated circuit is configured to store a copy of data retrieved from the memory in an array of memory bit cells and execute the instructions using the source data, wherein the array of memory bit cells comprises:
a plurality of rows and a plurality of columns, wherein a given memory bit cell of the array comprises a transistor stack that comprises a first transistor with a channel oriented in a first direction and a second transistor with a channel oriented in a direction orthogonal to the first direction.

16. The computing system as recited in claim 15, wherein a six transistor (6T) random access data storage of the given memory bit cell consumes a planar area above a silicon substrate of four transistors.

17. The computing system as recited in claim 15, wherein a highest metal layer used for signal routing in the given memory bit cell is a metal zero layer.

18. The computing system as recited in claim 15, wherein each of a read bit line and a write word line of the given memory bit cell of the array is routed in no other metal layer other than a local interconnect layer.

19. The computing system as recited in claim 15, wherein the transistor stack comprises an oxide layer between the first transistor and the second transistor.

20. The computing system as recited in claim 19, wherein:
a channel comprises a nanosheet; and
each of the first transistor and the second transistor is a vertical gate all around (GAA) device.

* * * * *